US009618389B2

(12) United States Patent
Hansen et al.

(10) Patent No.: US 9,618,389 B2
(45) Date of Patent: Apr. 11, 2017

(54) INTEGRATED DIGITAL DISCRIMINATOR FOR A SILICON PHOTOMULTIPLIER

(71) Applicant: Siemens Medical Solutions USA, Inc., Malvern, PA (US)

(72) Inventors: Peter Hansen, Knoxville, TN (US); Michael Casey, Louisville, TN (US); Stephan Siegel, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 14/938,894

(22) Filed: Nov. 12, 2015

(65) Prior Publication Data

US 2016/0061968 A1    Mar. 3, 2016

Related U.S. Application Data

(62) Division of application No. 13/556,331, filed on Jul. 24, 2012, now Pat. No. 9,217,795.

(51) Int. Cl.

| G01F 15/06 | (2006.01) |
|---|---|
| G01J 1/44 | (2006.01) |
| G01T 1/24 | (2006.01) |
| G01T 1/29 | (2006.01) |
| H03K 3/037 | (2006.01) |
| H03K 5/135 | (2006.01) |
| H03K 5/00 | (2006.01) |

(52) U.S. Cl.
CPC ............... G01J 1/44 (2013.01); G01T 1/248 (2013.01); G01T 1/2985 (2013.01); H03K 3/037 (2013.01); H03K 5/135 (2013.01); H03K 2005/00078 (2013.01)

(58) Field of Classification Search
CPC ........................................................ G01J 1/44
See application file for complete search history.

(56) References Cited

U.S. PATENT DOCUMENTS

| 2008/0203309 | A1 | 8/2008 | Frach et al. |
|---|---|---|---|
| 2011/0079727 | A1 | 4/2011 | Prescher et al. |
| 2011/0233413 | A1 | 9/2011 | Prescher et al. |
| 2012/0318989 | A1* | 12/2012 | Park ................. H01L 27/14609 |
| | | | 250/366 |

OTHER PUBLICATIONS

G.F. Knoll, Radiation Detection and Measurement, Third Edition, John Wiley & Sons, Inc. pp. 643-644.
Fant, K. M. (2005) Front Matter, in Logically Determined Design: Clockless System Design with NULL Convention Logic™, John Wiley & Sons, Inc., Hoboken, NJ, USA. doi: 10.1002/0471702897.fmatter Online ISBN: 9780471702894.

* cited by examiner

*Primary Examiner* — Daniel Puentes

(57) ABSTRACT

Apparatuses and methods are provided that minimize the effects of dark-current pulses. For example, in one embodiment of the invention, a method is provided where a first pixel is struck (i.e., a primary pixel). Pixels struck within a fixed time frame after the primary pixel is struck are referred to as secondary pixels. After a short fixed time frame has expired, the number of primary and secondary pixels is added. If the count exceeds a threshold, the primary pixel was activated by the first (or early) photon from a true gamma event. If the threshold is not met then it is likely the primary pixel generated a dark pulse that should be ignored.

4 Claims, 15 Drawing Sheets

[0088] TABLE 1

INTEGRATED DIGITAL DISCRIMINATOR FOR A SILICON PHOTOMULTIPLIER

CROSS-REFERENCE TO RELATED APPLICATIONS

This application is a divisional application of U.S. patent application Ser. No. 13/556,331 filed on Jul. 24, 2012, which is hereby incorporated by reference in its entirety.

BACKGROUND

Field of the Invention

Embodiments of the present invention generally relate to analog and digital discriminators, and more specifically to apparatuses and methods for minimizing the effects of dark-current pulses from Silicon Photomultipliers.

Description of the Related Art

Nuclear medicine is a unique medical specialty wherein radiation is used to acquire images that show the function and anatomy of organs, bones and/or tissues of the body. Radiopharmaceuticals are introduced into the body, either by injection or ingestion, and are attracted to specific organs, bones and/or tissues of interest. For example, the radiopharmaceutical (e.g., rubidium) is injected into the bloodstream.

The radiopharmaceutical produces gamma photon emissions that emanate from the body. One or more detectors are used to detect the emitted gamma photons and the information collected from the detector(s) is processed to calculate the position of origin of the emitted photon from the source (i.e., the body organ or tissue under study). The accumulation of a large number of events (e.g., a single gamma when using Single Photon Emission Computed Tomography ("SPECT") and coincident gamma events when using Positron Emission Tomography ("PET")) allows an image of the organ or tissue under study to be displayed.

FIG. 1 depicts a prior art system 100 that includes a known apparatus 102 for superposed magnetic resonance ("MR") and PET imaging. The apparatus 102 includes a known MR tube 104. The MR tube 104 defines a longitudinal direction Z (not shown), parallel to a longitudinal axis of a patient (also not shown), which extends orthogonally with respect to the plane of the drawing in FIG. 1.

As shown in FIG. 1, a plurality of PET detector units 106 arranged in pairs opposite each other about the longitudinal direction z is arranged coaxially within the PET scanner 104. The PET detector units 106 preferably include a silicon photo-multiplier ("SiPM") array 108.

A computer 120 is also included in the system 100. The computer 120 includes a central processing unit ("CPU") 114 for image processing of superimposed MR and PET images, a user interface 118 (depicted as a keyboard), and a monitor 116 for viewing input and output data.

The prior art SiPM array 108 is depicted in FIG. 2 and consists of an n×n array of pixels 202. For illustrative purposes the n×n pixel array 202 is depicted as a 5×5 pixel array. The Pixels in the array 202 are identified by an (x, y) index. For example, pixels along the "X" axis are denoted as 202(1,1), 202(1,2), . . . , and 202(1,5); and pixels along the "Y" axis are denoted as 202(2,1), 202(2,1), . . . , and 202(5,1).

Typically, each individual pixel is an m×m array of parallel microcells 204, with each microcell consisting of a reverse biased avalanche photodiodes ("APD") $206_1$, . . . , $206_m$ and an active or passive quenching mechanism such as resistors $208_1$, . . . , $208_m$ (collectively 206 and 208, respectively). Parasitic capacitance across the quench resistor 208 is also present.

The APD 206 is reverse biased to a voltage $V_b$, greater than the breakdown voltage $V_{brk}$. When a photon is absorbed in the junction, it can cause a photo-electron to be released. The photo-electron drifts to a region of high electric field where it accelerates and causes additional electrons to be released by impact ionization. During this breakdown, current flows through device as the junction discharges to the breakdown voltage. At this point, the junction recovers and again begins to function as reverse biased diode. During the following recovery phase, current flowing through the device charges the junction back to the bias voltage $V_b$. During a complete breakdown and recovery cycle, the net amount of charge released from the microcell is:

$$Q = (C_d + C_q)(V_b - V_{brk}) \qquad \text{Equation 1}$$

where $C_d$ is the diode junction capacitance, and $C_q$ is the parasitic capacitance across the quench resistor.

A scintillator (not shown) attached to the SiPM sensor 108 converts a high energy gamma-ray to many photons. The photons cause multiple cells to breakdown. Since the cells of an SiPM sensor 108 are biased beyond $V_{brk}$, they also breakdown randomly at a high rate due to thermal effects, causing dark-current pulses.

Since dark pulses appear identical to the first photoelectron from a true event, the high rate of dark-pulses can limit the performance of the discriminator. In some cases, a small subset of microcells may contribute to most of the dark-pulses. In this case, others reduce the effect of noisy microcells by deactivating them, requiring a unique look-up table for each SiPM sensor. However, this is not an ideal solution since the remaining microcells still create dark pulses, and it is cumbersome to have a unique look-up table for each SiPM sensor.

There is a need in the art for a design that does not unnecessarily deactivate pixels to reduce false triggers due to dark pulses.

SUMMARY

Embodiments of the present invention generally relate to computed tomography and more specifically to discriminators and more specifically to apparatuses, methods, and computer-readable mediums for minimizing the effects of dark-current pulses. For example, in one embodiment of the invention, a method is provided where a first pixel is struck (i.e., a primary pixel). Pixels struck within a fixed time frame after the primary pixel is struck are referred to as "secondary pixels." After a short fixed time frame has expired (e.g., about 1 ns to about 5 ns), the number of primary and secondary pixels is added. If the count exceeds a threshold, it is clear the primary pixel was activated by the first (or early) photon from a true gamma event. If the threshold is not met, then it is likely the primary pixel generated a dark pulse that should be ignored.

Other embodiments of the invention are provided that include apparatuses and methods having features similar to the method described herein.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only one embodiment of this invention and is therefore not to be considered limiting of its scope, for the invention may admit to other equally effective embodiments.

FIG. 15 depicts TABLE 1; and

FIG. 16 depicts TABLE 2.

To facilitate understanding, identical reference numerals have been used, wherever possible, to designate identical elements that are common to the figures.

DETAILED DESCRIPTION

Figure 1:
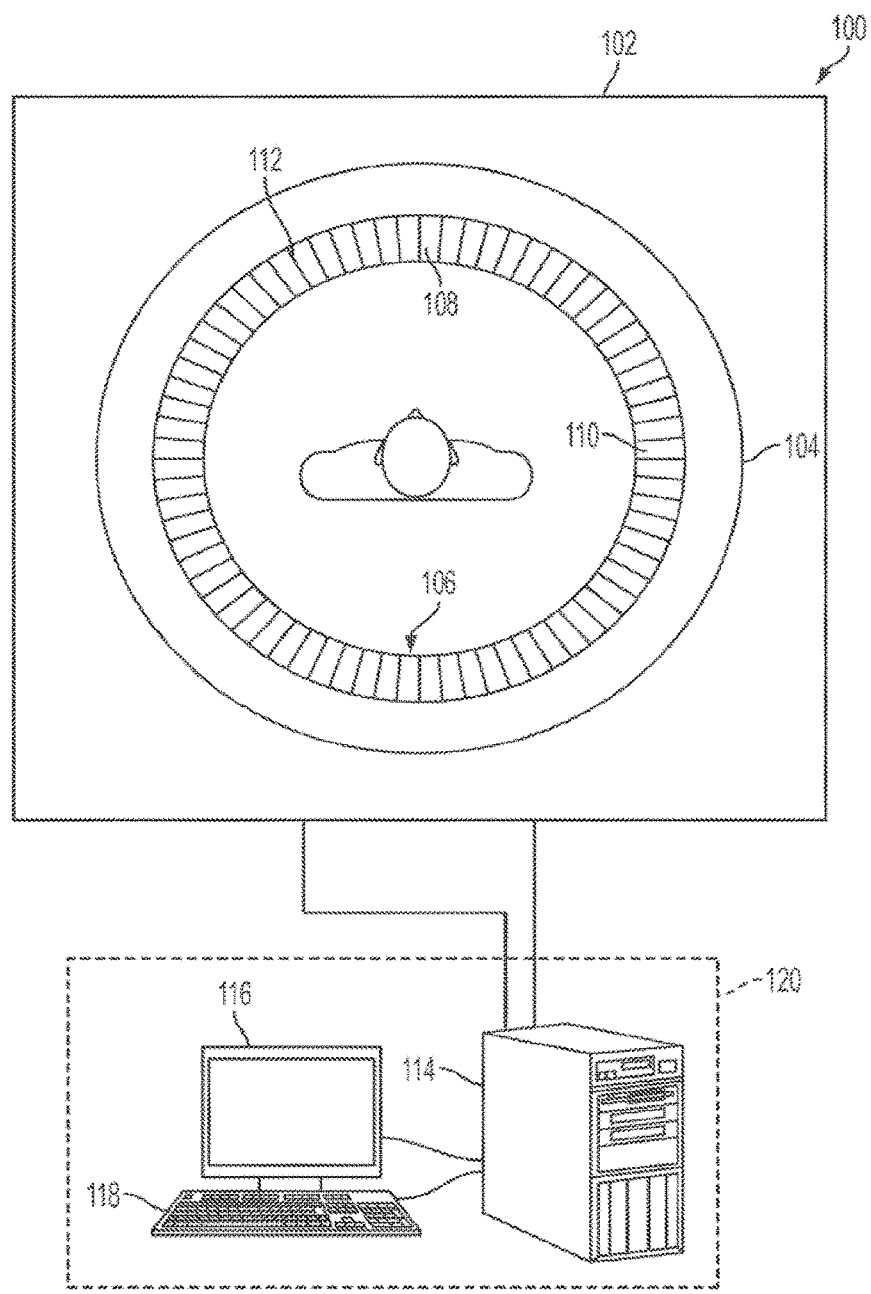
FIG. 1 depicts a prior art scanning system
Figure 2:
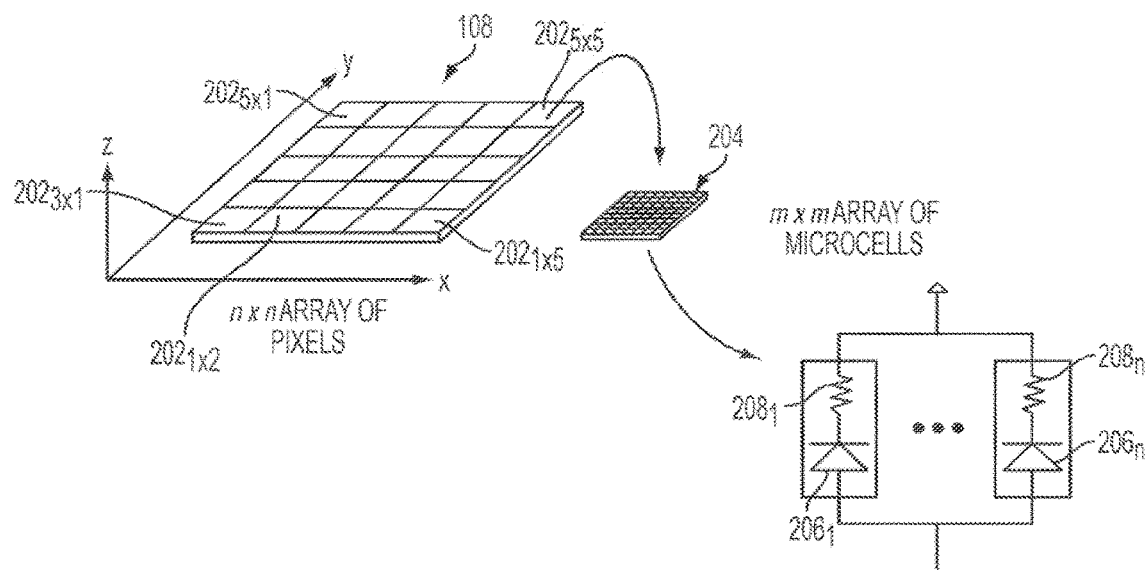
FIG. 2 depicts a prior art sensor.

In the following description, numerous specific details are set forth to provide a more thorough understanding of the invention. As will be apparent to those skilled in the art, however, various changes using different configurations may be made without departing from the scope of the invention. In other instances, well-known features have not been described in order to avoid obscuring the invention. Thus, the invention is not considered limited to the particular illustrative embodiments shown in the specification and all such alternate embodiments are intended to be included in the scope of the appended claims. Although embodiments of the invention can be used in a combined PET/MR system the invention is not limited to these systems. For example, other embodiments of the invention can be used in a combined PET/CT or standalone PET.

Embodiments of the discriminator described herein generate a time-mark when it detects the first (or early) photo-electron from a Silicon Photomultiplier ("SiPM"), and avoids false triggering due to dark-current pulses common to these types of devices. Embodiments of the discriminator architecture includes a sensor divided into blocks which can be processed concurrently, to prevent the performance of a large sensor from being degraded. Logic in the digital discriminator operates asynchronously to allow pixels that detect dark-current pulses to be cleared and enabled more quickly than possible in a clocked system. The discriminator also generates a final count of microcells for energy estimation after qualifying the event as being due to a gamma-ray. In addition, counts can be generated at intermediate intervals to estimate the decay time of a gamma-event as an aid in analyzing the depth-of-interaction of the gamma event by a downstream process. Depth-of-interaction can be used to make timing corrections to further improve timing.

Another advantage associated with embodiments disclosed herein is a utilization of a fully digital approach to integrate light output from a region, or block, that minimizes the effects of noise. As described in further detail below, a time-mark is generated from the first (or early) photo-electron from an event, and qualified (as an actual gamma-event) after a statistically significant number of microcells have detected additional photons from the same event. In this way, dark-current pulses are prevented from generating a time-mark without the need to deactivate noisy pixels. This approach will improve the overall system throughput by preventing false trigger events due to dark pulses. However, it is appreciated that other embodiments of the invention do not preclude deactivating noisy microcells to further enhance system throughput.

The arrival time of a gamma-ray is based upon when charge from the event can first be reliably detected. The best timing can generally be achieved by detecting the first photo-electron from the gamma-event. The leading edge of a pulse due to the first photo-electron from a gamma-event is identical to a dark-current pulse. A discriminator is the first element in the electronics processing chain. The method described herein improves throughput since it rejects the dark-current pulses, but still detects the first photo-electron from the gamma-event. This improves efficiency by saving downstream resources for processing true gamma-events when they arrive.

In various embodiments of the invention, the structure of the SiPM sensor and front-end processing is analog. In the embodiment described herein, the structure of the SiPM sensor and the front-end processing are digital. In a hybrid approach, the same discrimination principle described in this embodiment is applied to groups of microcells in a hierarchical approach. Since a response to the many photons released from a detector spans a wide dynamic range, it can be more difficult to detect the first photo-electron in a purely analog system.

When the front-end processing is analog, a Leading-Edge Discriminator ("LED") with a low threshold set above the thermal noise floor can be used to detect the first photo-electron. In addition, the area and power consumption of the analog channel are important design considerations.

Figure 3:
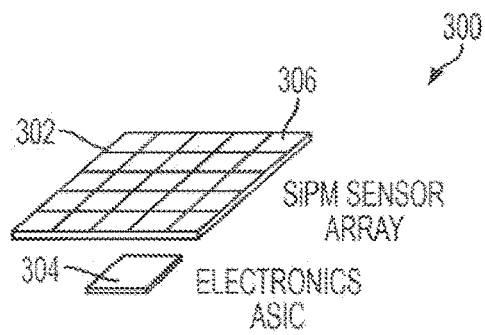
FIG. 3 depicts close coupling of the electronics with a SiPM sensor.

In other embodiments of the invention, a fully digital front end can be used when individual microcells from the SiPM sensor are available. For example, FIG. 3 depicts an embodiment of a digital discriminator 300 (aka bonded circuit 300) that includes a SiPM sensor 302 bonded directly to an application specific integrated Circuit ("ASIC") 304. For illustrative purposes only, the SiPM sensor 302 is depicted as having a 5×5 array of pixels 306. However, it appreciated that various embodiments of the invention include a SiPM sensor 302 having a different size array of pixels 306 (e.g., an 8×8 array of pixels 306). In an alternative hybrid SiPM embodiment, groups of microcells are summed together hierarchically, and provide a reduced set of inputs to the discriminator. The same general principle is used to avoid false triggers due to dark pulses.

In the fully digital embodiment described here, since the SiPM sensor 302 is bonded to the ASIC 304, a quench resistor (not shown) can be moved from the SiPM sensor 302 to the ASIC 304 simplifying both components. This improves the packing efficiency of the SiPM sensor 302, and manufacturing compromises needed to integrate resistors and/or transistors into the sensor are eliminated.

The fully digital discriminator 300 described here receives inputs from each microcell. However, an analog or hybrid approach can be implemented based on the same principle. In a fully digital solution, all components of the processing chain can be integrated on the same ASIC, including a Time-to-Digital Converter (TDC).

Figure 4:
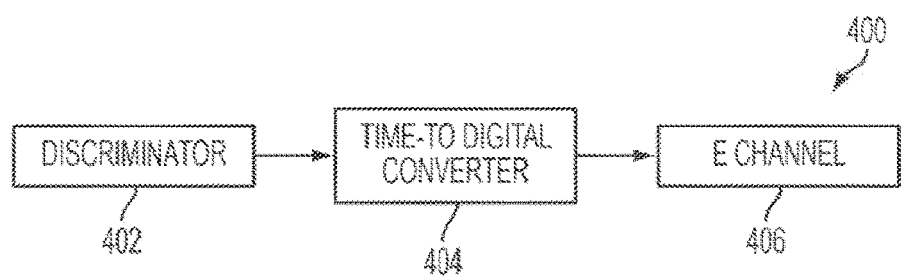
FIG. 4 depicts a high level block diagram of an exemplary processing chain in accordance with embodiments of the invention.

FIG. 4 depicts a high level block diagram of an exemplary processing chain 400 in accordance with embodiments of the invention. The processing chain 400 includes a discriminator 402, a TDC 404, and an energy channel 406.

The discriminator 402 generates a time-mark logic pulse when a gamma-event is detected. The timing of the first photo-electron may provide the best timing of an event. The discriminator 402 ignores dark-current pulses, improving its throughput compared to other implementations used in the prior art.

When the discriminator 402 detects an event, the TDC 404 and energy channel 406 further process data. Since each (i.e., the TDC 404 and the energy channel 406) requires processing time and consumes power, responding to dark-current pulses lowers efficiency. By ignoring dark-current pulses, the signal processing chain 400 can remain ready to process true gamma-events.

The TDC 404 assigns a digital time-stamp to the time-mark generated by the discriminator 402. The energy channel 406 estimates the energy of the gamma-event by integrating charge from the SiPM pixels affected by the event. One of the advantages of the digital embodiment described here is that estimation of the gamma energy can be done with the same components in the discriminator, after the event has been verified to not be a dark pulse. In an analog implementation, additional integration of the current produced by microcells activated by the event is needed to estimate the overall energy of the event.

A true gamma-event will cause many microcells from the first pixel struck (aka the "primary pixel") and adjacent pixels (aka the "secondary pixels") to discharge in a short time interval after the first photo-electron. If the photo-electron is followed closely by charge from the primary or secondary pixels, embodiments of the invention indicate that it is likely that the first (or early) photo-electron came from a gamma-event instead of a dark-current pulse.

In other embodiments of the invention, a sum of the charge from the primary pixel and its secondary pixels can be used to determine whether the sum exceeds a threshold (indicative of an actual event when exceeding the threshold or a dark-current pulse when not exceeding the threshold).

Figure 5:
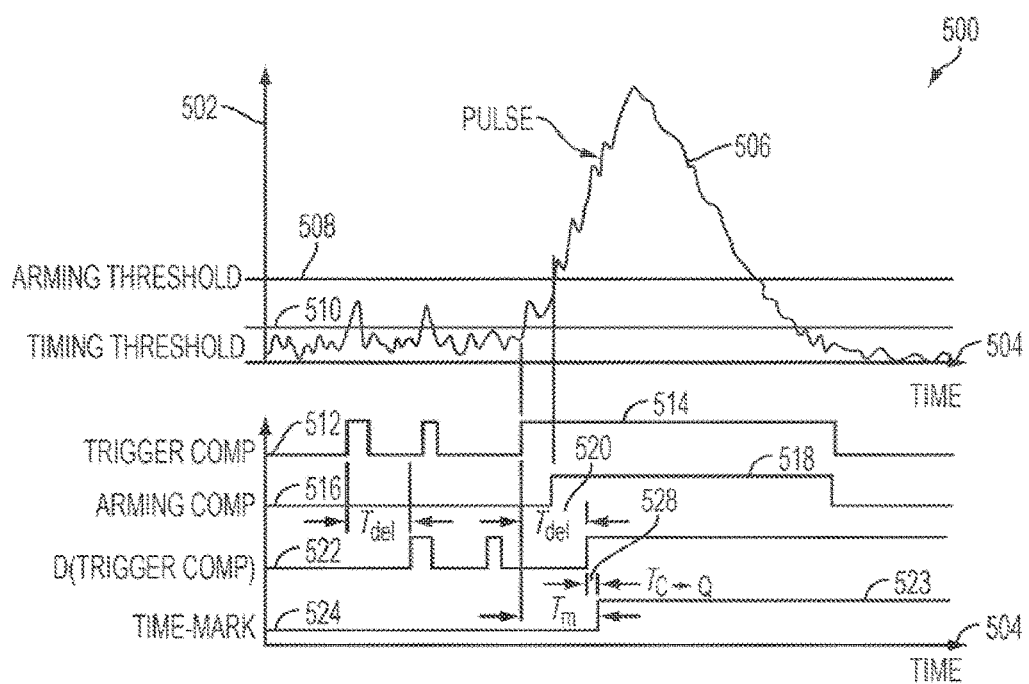
FIG. 5 depicts an exemplary discriminator timing sequence in accordance with the embodiments of this invention and demonstrates the operating principle of the discriminator.

FIG. 5 depicts an exemplary discriminator timing sequence 500 in accordance with embodiments of the invention. This figure shows the general principle of operation for an analog, digital, or hybrid implementation. The timing sequence 500 includes a "Y-axis" 502 delineating a magnitude of a pulse waveform 506, an arming threshold 508, a timing threshold 510, and logic levels for various signals: a trigger comparator ("Trigger Comp") output 512, an arming comparator ("Arming Comp") output 516, the delayed trigger comparator output "D(Trigger Comp)" 516, a time-mark 524; and an "X-axis" 504 delineating time. The pulse waveform 506 represents the charge accumulation from the primary and secondary pixels in a fully digital implementation, or the net charge generated by an analog SiPM.

The trigger comparator output "Trig Comp" 512 generates a logic pulse 514 when the pulse waveform 506 exceeds the Timing Threshold 510. The output "Trig Comp" 512 is delayed by $T_{del}$ 520 to form the delayed output "D(Trigger Comp)" 516.

$T_{del}$ 520 is chosen longer than the time required for the aggregate pulse waveform 506 to be formed and exceed the Arming Threshold 508.

The "Arming Comp" 516 generates a high logic pulse 518 when the pulse waveform exceeds the arming threshold 508. The output of the Arming comparator is applied to the D-input of a flip-flop.

In the case of a gamma ray, the delayed output of the trigger comparator "D(Trigger Comp)" 522 creates a positive going edge at the clock-input of the flip-flop after the arming threshold 508 is exceeded. Hence, the delayed output of the trigger comparator "D(Trigger Comp)" 522 clocks the flip-flop after sufficient set-up time has elapsed. The flip-flop is set only when the magnitude of the waveform pulse 506 exceeds the arming threshold 508. The output of the flip-flop creates the "Time-mark" ($T_m$) 524 when set, and is valid after an additional fixed clock-to-Q ($T_{c \to Q}$) time delay 528. Since a dark-current pulse never exceeds "Arming Threshold" 508, it never changes the state of the flip-flop. The delay of the time-mark $T_m$ 524 is equal to $T_{del}$ 520 plus $T_{c \to Q}$ 528. Since these are fixed delays, they cause no relative timing errors between opposing detectors.

Figure 6:
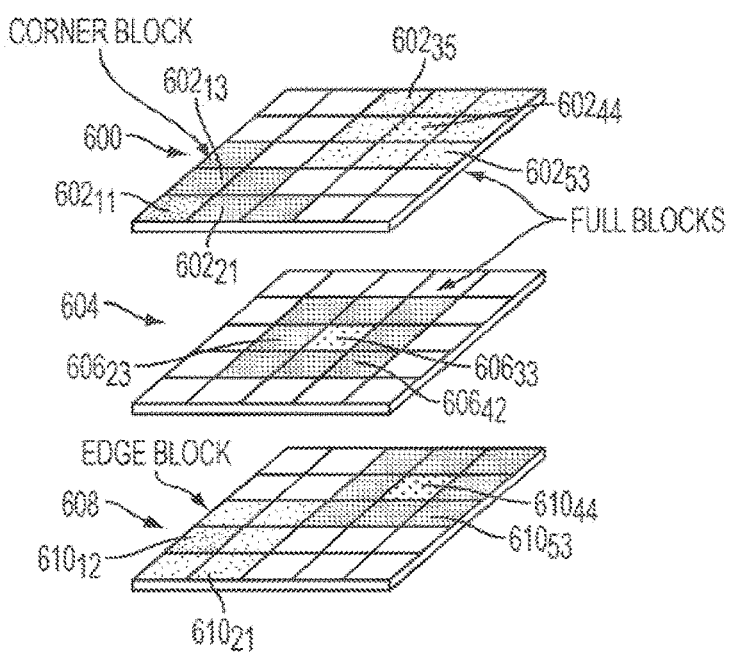
FIG. 6 depicts an exemplary bonded circuit in accordance with embodiments of the invention.

FIG. 6 depicts examples of non-overlapping blocks in a bonded circuit 300 in accordance with a fully digital embodiment of the invention. Although the bonded circuit 300 includes an ASIC, for simplicity the ASIC is not shown. In addition, for illustrative purposes, each of the SiPM sensors 302 is depicted as having a 5×5 array of pixels. However, it is appreciated that in other embodiments of the invention the SiPM sensor 302 can have a differently sized array of pixels (e.g., 8×8, 10×10, 13×13, or more).

A pixel in which the first photo-electron is detected is referred to as the primary pixel. In this embodiment of the invention, contributions from secondary neighboring pixels are added to the primary pixel to generate an arming signal to qualify it as a gamma-event. In various embodiments of the invention, the contribution of primary and secondary pixels may also be summed to estimate the gamma energy after a longer integration interval (e.g., about 50 ns to about 100 ns).

In the examples provided in FIG. 6 (i.e., examples 600, 604, and 608), the primary pixel in each block is shaded darker than the secondary pixels associated therewith. Three different types of blocks are shown and are categorized as: a Full block, an Edge block, or a Corner block. In each of the examples 600, 604, and 608, pixels are identified by an (x, y) index. Each of the pixels has a plurality of microcells (not shown) configured in an m×m array.

Note that in each of the examples 600, 604, and 608 none of the primary pixels have the same secondary pixels during the same event time. As a result, the primary pixels are considered non-lapping and concurrent analysis of the block(s) can be performed.

Specifically, example 600 includes primary pixels $602_{11}$ and $602_{44}$. Primary pixel $602_{11}$ is a corner block. Because primary pixel $602_{11}$ is a corner block (because the primary pixel $602_{11}$ is in the corner) there are five secondary pixels (e.g., secondary pixel $602_{21}$) that can be struck to indicate that an actual gamma-event has occurred. Primary pixel $602_{44}$ is a full block and has eight secondary pixels (e.g., secondary pixels $602_{35}$ and $602_{53}$) that can be struck to indicate that an actual gamma-event has occurred.

In example 604, primary pixel $606_{33}$ is part of a full block (i.e., having a primary pixel that is neither a corner pixel nor and edge pixel) and has eight secondary pixels (e.g., secondary pixels $606_{42}$ and $606_{23}$) that can be struck if an event is an actual gamma-event.

In example 608, primary pixel $610_{12}$ is part of an edge block (i.e., because the primary pixel $610_{12}$ is an edge pixel) and has five secondary pixels (e.g., secondary pixel $610_{21}$) that can be struck to indicate that an actual gamma-event has occurred.

Primary pixel $610_{44}$ is part of a full block and operates as explained above regarding primary pixel $602_{44}$ in example 600.

Some of the advantages associated with dividing the SiPM sensor 302 into blocks are: limiting the set of secondary pixels to a block around the primary pixel to reduce the noise contribution from pixels outside the block, which contribute little to the arming and/or energy signals; and non-overlapping blocks can be processed independently to help preserve the efficiency of a large sensor array. Smaller blocks allow more processing channels to work concurrently, allowing each detector to process more events.

The size and shape of various block structures are determined for the number of pixels in the sensor based on light output simulations of the detector.

When adequate resources are available, the electronics, ASIC can process multiple blocks concurrently. This isn't difficult using an ASIC having a small feature size (e.g., 0.18 micro, 0.13 micro, 65 nm, etc.).

Figure 7:
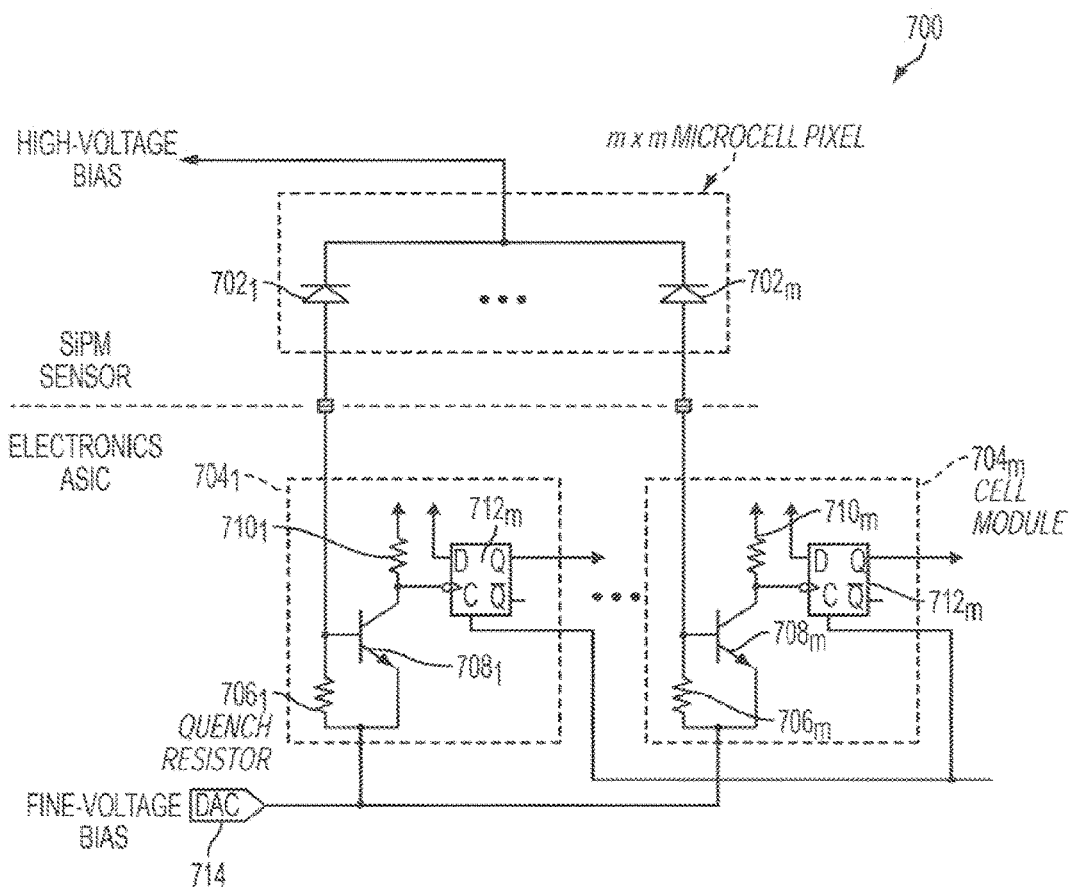
FIG. 7 depicts exemplary cell modules that interface to a sensor pixel in accordance with embodiments of the invention.

FIG. 7 depicts an exemplary 700 cell module and interface to a sensor pixel (i.e., an m×m microcell pixel 702) in accordance with the fully digital embodiment of this invention. There is provided a contact for each microcell 702 on the sensor 302 that allows a quench resistor 706 to be moved to the electronics ASIC (i.e., on a respective Cell Module 704).

A respective Cell Module (Cell Module $704_1$, ..., Cell Module $704_m$ (collectively Cell Module 704)) is connected to a respective microcell (microcell $702_1$, ..., microcell $702_m$ (collectively microcell 702)), as shown in FIG. 7. For example, Cell Module $704_1$ is connected to microcell pixel $702_1$.

Each Cell Module 704 includes a quench resistor 706 (quench resistor $706_1$, ..., quench resistor $706_m$ (collectively quench resistor 706)), a transistor 708 (transistor $708_1$, ..., transistor $708_m$ (collectively transistor 708)), another resistor 710 (resistor $710_1$, ..., resistor $710_m$ (collectively resistor 710)), and a flip-flop 712 (flip-flop $712_1$, ..., flip-flop $712_m$ (collectively flip-flop 712)).

The junction of the transistor 708 is recharged faster than the time required to determine whether an event is a dark-current pulse, for optimal performance. The quench resistor 706 allows the transistor 708 to recharge faster. In other embodiments of the invention, an active quench circuit is used (in place of the quench resistor 706).

The transistor 708 (e.g., a fast bipolar transistor or a CMOS device) provides a sharp transition to the clock port of the flip-flop 712.

The flip-flop 712 is in an enabled state while waiting for an event. The flip-flop 712 is set when the microcell 702 discharges.

The voltage at the anode of all microcells 702 in a pixel is adjusted through each quench resistor 706 (or other active circuit) by a digital-to-analog converter ("DAC") 714. The DAC allows fine gain changes of each pixel to compensate for variations in process, voltage, and temperature ("PVT"), and can be adjustable over a small range (about 1 volt) in small steps.

During operation, the flip-flop 712 is set when a microcell 702 discharges, and stays set until it is cleared. The quench resistor 706 stops the breakdown of the cell 702, and allows it to recharge quickly. The cell 702 recovers before the time period needed to determine whether the discharge was due to a dark-current pulse, so it can be returned to operation with a minimum dead-time. Until the Cell Module 704 is reset, subsequent breakdown of the cells 702 is ignored, since the flip-flop 712 is not cleared until the event processing is complete. It is unlikely photons from the same gamma-event will trigger the same microcell more than once. Breakdowns within the time frame of the current event are more likely due to additional dark-current pulses. Each cell module 704 is connected to the digital-analog converter 714 ("DAC") to allow fine control of the SiPM anode bias voltage.

Figure 8:
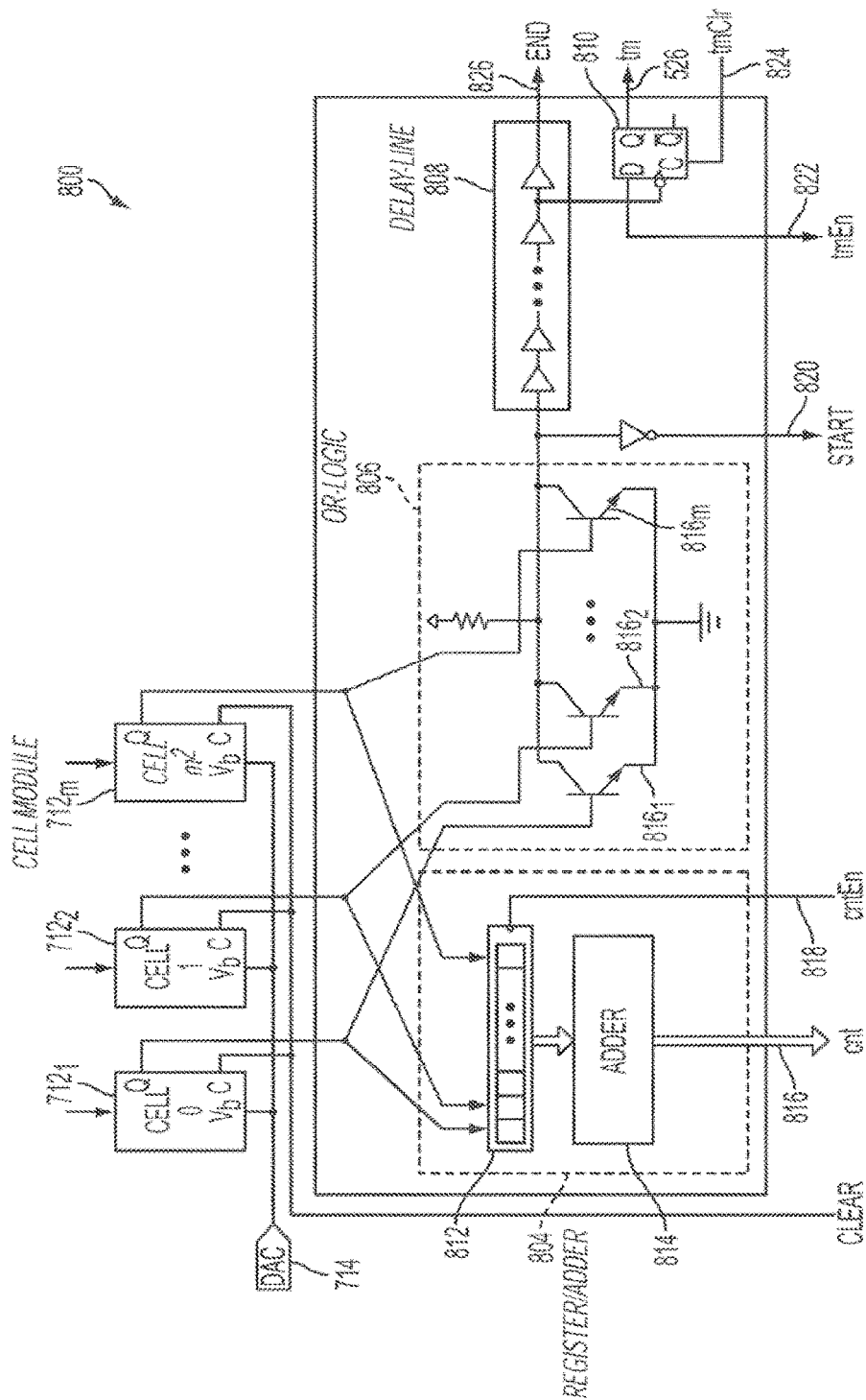
FIG. 8 depicts an exemplary pixel module in accordance with embodiments of the invention.

FIG. 8 depicts an exemplary Pixel Module 800 in accordance with embodiments of the invention. The Pixel Module 800 is the processing element for each pixel. The Pixel Module 800 receives input from each flip-flop 712 in the Cell Module 704 (for simplicity the Cell Module is not depicted in FIG. 8).

Each Pixel Module 800 includes a register/adder module 804, an OR-Logic module 806, a delay-line 808, and a flip-flop 810.

The register/adder module 804 captures the number of Cell Modules (not shown) that are set (via a respective flip-flop 712), and then generates a sum. The register 812 captures the state of all the Cell Modules in the pixel on the rising edge of cntEn 818. Since the inputs to the register 812 are asynchronous to the clock signal from the flip-flop 712, there is some risk of metastability.

Metastability may cause one or more bits to briefly oscillate before settling, which can cause counting errors. This condition can be virtually eliminated by allowing adequate time for the register 812 to settle before reading the output of the adder 814, double registering, and using well designed registers with a small set-up and hold time. A small number of errors will not have any significant effect on the outcome of the calculation. In this particular digital implementation, the contents of the adder 814 will be captured twice. The first count will be used to qualify if a pulse was due to a gamma-event by counting the number of cells set in the primary pixel, and optionally adding the sum of all secondary microcells set in the block. If the total count exceeds a threshold, a gamma-event will have been detected. In this case, the discriminator 300 will issue the time-mark pulse tm 526. The counting process will then continue for an extended period to allow the pixel module 800 to count all the photons in the block for the event. The total number of microcells set after this extended counting period will provide a measure of the energy of the gamma-ray. This longer term count can be used to further qualify the gamma energy.

The Or-Logic block 806 produces a logic pulse when any microcell in the pixel is set. To generate at time-mark quickly, fast bipolar transistors should be used, and capacitance minimized by using the smallest transistors possible (with high transconductance). In other embodiments of the invention, a hierarchical triggering approach is utilized to reduce the number of connections between the SiPM array and discriminator. The output of this block generates a "start" signal 820 to the controller (not shown).

The Delay-line 808 delays the "start" signal 820 from the Or-logic block 806 by a fixed time delay before the time-mark tm 526 is generated by pixel module 800. This time mark is issued a fixed delay after the first flip-flop 712 is set, corresponding to the first photoelectron being detected by the pixel module 700. The length of this time delay is determined by the delay line 808, and corresponds to $T_{del}$ 520. As described in the analog embodiment of the invention 500, this delay must be long enough to enable the sum of all microcells in the current pixel (or block) to be determined. If the event is valid, the controller will assert the tmEn signal 822 flip-flop 810 to be set. The flip-flop 810 is clocked by the delay line 808 to generate the time-mark input to the TDC 404 (not depicted in FIG. 8). The TDC 404 should clear the flip-flop 810 soon after it is detected by pulsing tmClr 824. If the event was not due to a gamma-ray, the controller will mask the D-input of the flip-flop 810. The "end" signal 826 informs the controller that the delay line 808 has been flushed. The delay line 808 implementing $T_{del}$ is a resource belonging to each pixel module. Since every pixel has the resources to generate a time-mark, multiple pixels can operate concurrently if they don't use secondary pixels already in use by another block.

The delay-line 808 is used for timing, and is optimized for low jitter, and longer term variations due to voltage and temperature. Fixed process variations are not important since they can be calibrated out. Variations in the delay cells can be minimized by a Delay-Lock-Loop ("DLL") (described below and depicted in FIG. 9).

Figure 9:
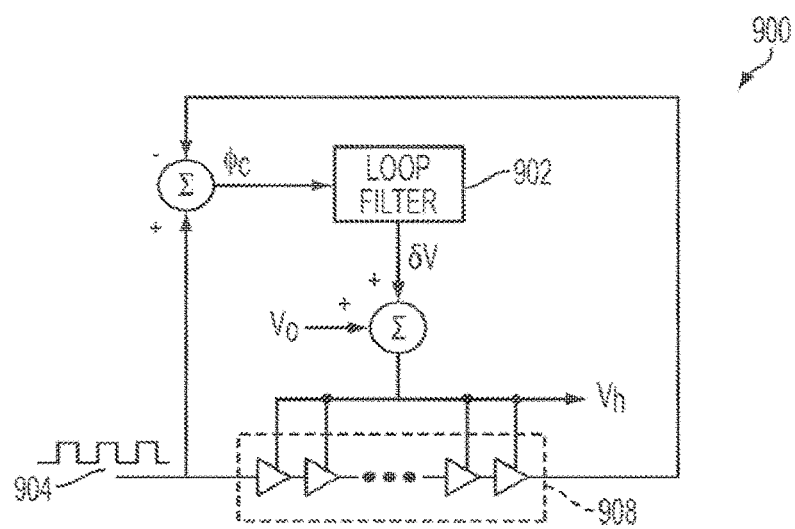
FIG. 9 depicts an exemplary DLL in accordance with embodiments of the invention.

FIG. 9 depicts an exemplary DLL 900 in accordance with embodiments of the invention. In the DLL 900, a precision reference clock 904 supplies a signal to a reference delay line 908. The length of the delay-line 908 is approximately equal to the period of the clock. The phase between the reference clock 904 and the output of the delay line 908 is compared to produce an error signal. The loop-filter 902 applies a gain and limits the bandwidth of the error signal to generate a correction added to a nominal bias voltage. The corrected bias voltage compensates the delay cells in 908 for voltage and temperature variations. A very low-bandwidth loop filter reduces jitter. The same bias voltages can then be used to compensate other critical delay lines in the design, such as used in the pixel modules 808. Multiple DLLs can be used depending on the size of the electronics ASIC (not shown). In this way, all delay lines are calibrated using 908 as a reference.

The controller also uses delays that can be stabilized by the delay line 908, although delays required by the controller do not need to be as precise. For example, taps in the controller delay will be used for internal timing signals Taps in the delay-line 808 in the pixel module 800 will not be used for control, to avoid introducing jitter.

Figure 10:
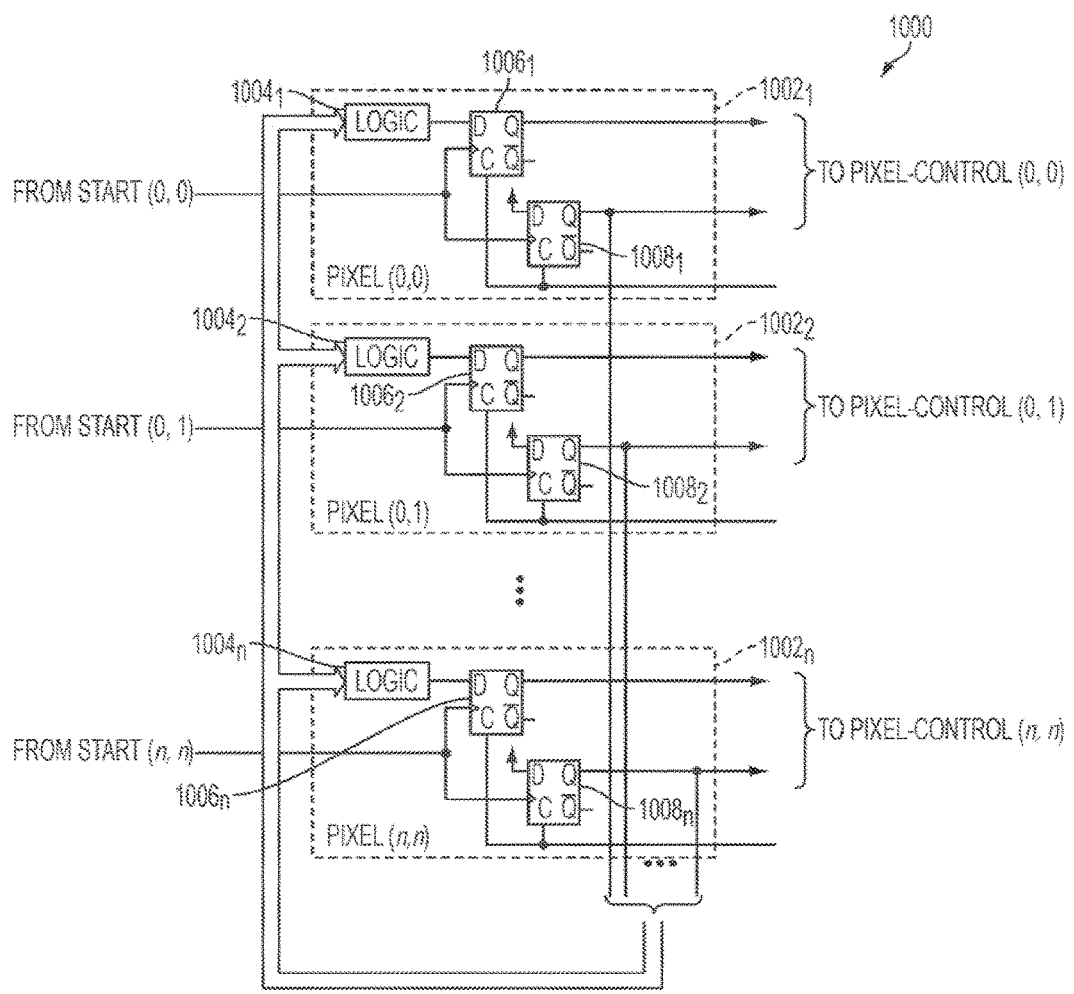
FIG. 10 depicts an exemplary event control module in accordance with embodiments of the invention.

FIG. 10 depicts an exemplary Event Control Module 1000 in accordance with the fully digital embodiment of the invention. The Event Control Module 1000 includes n×n segments, one corresponding to each Pixel Module 1002 (illustratively depicted in FIG. 10 as segment 1002₁, 1002₂, . . . , 1002ₙ (collectively referred to herein as Event Control Module segments 1002)); logic circuitry 1004 (illustratively depicted in FIG. 10 as logic circuitry 1004₁, 1004₂, . . . , 1004ₙ (collectively referred to herein as logic circuitry 1004)); flip-flop 1006 (illustratively depicted in FIG. 10 as flip-flops 1006₁, 1006₂, . . . , 1006ₙ (collectively referred to herein as flip-flop 1006)); and flip-flop 1008 (illustratively depicted in FIG. 10 as flip-flops 1008₁, 1008₂, . . . , 1008ₙ (collectively referred to herein as flip-flop 1002)).

When a primary Pixel Module detects a microcell has been triggered, it will request processing by the Pixel Control Module. A state-machine (not shown) in the Pixel Control Module will then supply timing signals to both primary and secondary pixels in the block. The Event Control Module 1000 decides if a pixel should process an event or ignore it. To process the event, the secondary pixels in the block must be available for counting pixels. If one or more secondary pixels are not available, the event will be ignored. Once processing of an event has started, all pixels in the block will remain in a busy state until processing of the event is complete. While the block is busy, other primary pixels that are triggered, and would use one or more secondary pixels that are already busy, will ignore those events. In principle, only one primary pixel is allowed to control a secondary pixel in its block during the time period required to process the event.

One segment of the Event Control Module 1000 is reserved for each pixel 1002. The start signal from each pixel clocks two flip-flops (i.e., flip-flop 1006 and flip-flop 1008) in the segment corresponding to the pixel. The states of flip-flop 1006 and flip-flop 1008 are inputs to the Pixel Control Module state-machine (not shown).

Flip-flop 1006 signals the Pixel Control Module that an event has been detected by the pixel module 1002. The output of flip-flop 1008 depends on the state of the registers (not shown) in the Event Control Module 1000. Flip-flop 1008 is set only if the secondary pixels that would be needed by the block are available. This is determined by logic 1004, which is a function of the primary pixels that are currently busy. The busy pixels are maintained by the state of the registers in the event control module 1000. If the secondary pixels are not available, the pixel control module 800 will ignore the event, and reset the primary pixel. If the secondary pixels are available, the state-machines take control of the primary and secondary pixels to process the event.

Since the start signal 820 from each Pixel Module block arrives asynchronously, there is a small probability that a conflict will not be prevented, leading to an occasional counting error. Fast event control module logic will minimize this risk. Infrequent errors will not have a significant impact on the efficiency of the discriminator. The effect of this error is similar to gamma-rays that deposit energy in adjacent detectors. In both cases, the event data will be ignored since it will not pass the energy qualification.

Logical expressions are needed to determine if a primary pixel can process events. A block is defined for each primary pixel, and defines the secondary pixels needed to determine if the event is due to a gamma-ray. The set of all pixels that are currently busy is a function of the primary pixels that are currently processing events, and their secondary pixels.

Methods for deriving a logical expression for a large detector array can be described. For example, returning to the 5×5 detector 300 depicted in FIG. 6, let the ordered pair of integers (x,y) identify the location of each pixel. Assume three block geometries are defined for this sensor, as shown in FIG. 6. The block types are Corner ("C"), Full ("F"), and Edge ("E"). More elaborate shapes can be determined for larger detectors based on light-output studies. Table 1, below, lists each primary pixel on the left, with the block shape in column T (type). Note that the table demonstrates a simple repetitive pattern that can be extrapolated for larger sensor arrays.

The pixel locations are also displayed in columns across the top. A "1" appears in the x-y grid if the pixel in the column is secondary for the primary pixel in the row. Pixels along the diagonal (dark-gray) correspond to the primary pixel. In the simple example, TABLE 1 is anti-symmetric relative to the center row and column (light-gray), due to the symmetry of the detector. For example, the last row is identical to the first row, but in reverse order. Similarly the last column is identical to the first column, again in reverse order.

Figure 16:
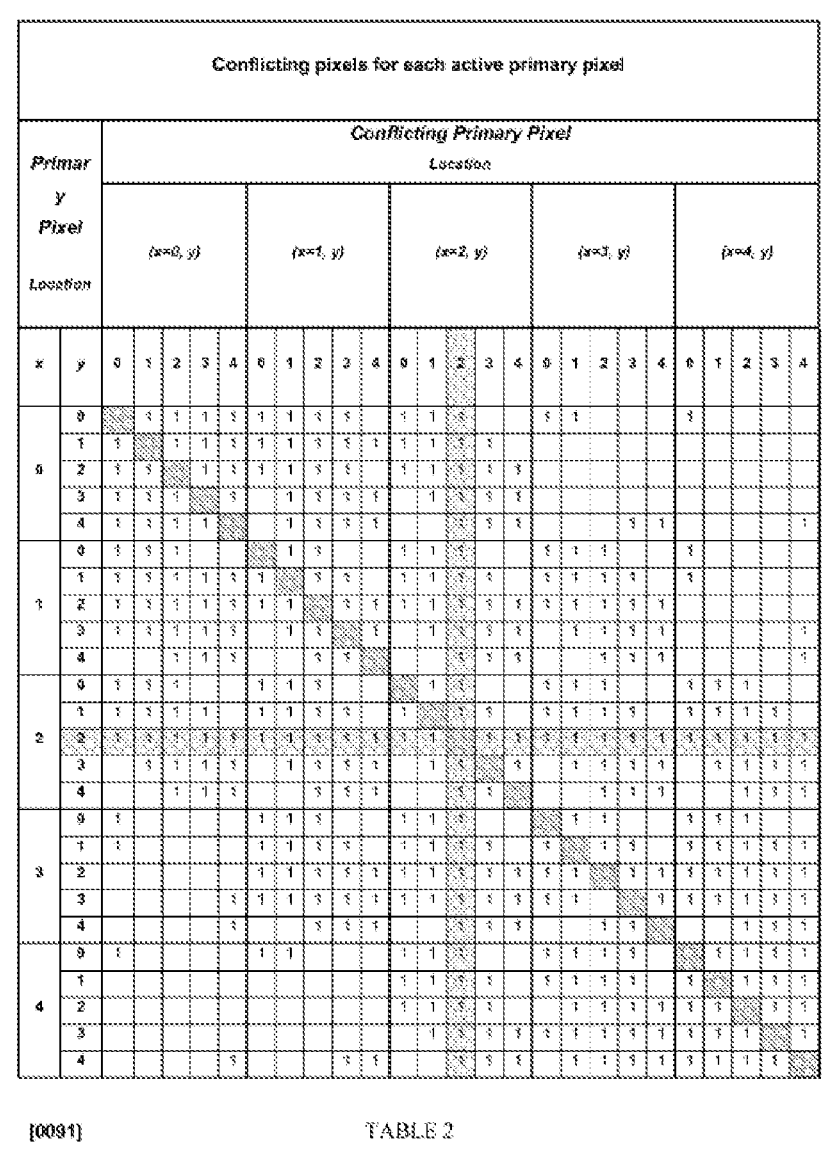

TABLE 2, seen in the FIG. 16 can be derived from TABLE 1.

For example, to derive the list of pixels that would conflict with primary pixels (3,2):

1. Find the row in TABLE 1 corresponding to primary pixels (3,2);
2. Columns in this row marked "1" are the secondary pixels for the primary pixels (3,2). For each column containing a "1" (in this row), consider all other rows in this column. If any row contains a "1," mark the primary pixel (on the left) with a "1."
3. Repeat step 2 for the remaining columns in the row corresponding to primary pixel (3,2), marking the primary pixels as above. Pixels on the left may be marked multiple times.
4. Any pixel on the left of TABLE 1 marked with a "1" conflicts with pixel (3,2). This list of marked pixels becomes the row for pixel (3,2) in TABLE 2.

Note that TABLE 2 can be used to derive the logic functions used by the event control module. This table is also anti-symmetric relative to the middle row and column, similar to TABLE 1. This demonstrates that TABLE 2 can be generated by a simple repeatable process, and extended to larger sensor arrays.

When the primary pixel is active, counts of microcells are generated at least twice.

The first count determines whether enough microcells have been set after a short time delay to determine if the event was due to a gamma or a dark-current pulse. In some embodiments of the invention, this count is due to the number of primary cells set. In other embodiments of the invention, the count is due to the sum of primary and secondary cells in the block. Determination of which embodiment to use can be determined by simulating the light output of the detectors.

A second count may be used to determine total number of cells set in the block after a longer integration interval, and can be used to estimate the gamma-energy. This count will occur during an extended period only after a gamma-event is detected. The counting period is long enough for most of the light to be collected from the detector. This feature is not a requirement for the discriminator to reject dark pulses, but is a convenience since the resources are available to generate photon counts.

Additional cell counts can also provide information about the rate at which the light output from the detector is decaying. This is useful for estimating the depth of interaction in the detector.

Figure 11:
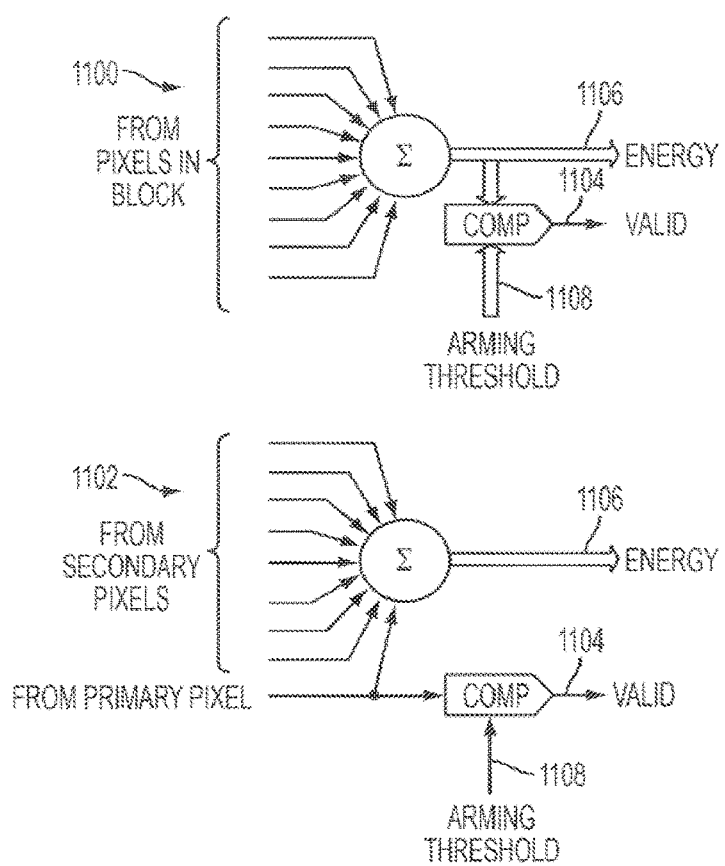
FIG. 11 depicts exemplary block adder/comparator in accordance with embodiments of the invention.

FIG. 11 depicts exemplary block adder/comparators 1100 and 1102 in accordance with the fully digital embodiment of the invention. Block adder/comparator 1100 forms the sum of all cells in the block to determine the type of event that occurred. Block adder/comparator 1102 uses the cells in the primary pixel. In block adder/comparators 1100 and 1102, the valid signal is an input to the pixel control module, and is set to logic "1" when the output exceeds the arming threshold 1108. The energy out 1106 is generally formed by adding the number of cells set in the primary and secondary pixels in the block, and is optionally used for an energy qualification. The same arming threshold 1108 is common to all pixels, and performs the equivalent function 508 in FIG. 5. A block adder/comparator 1100 and block adder/comparator 1102 are allocated for each pixel, with inputs from the primary and secondary pixels in the block.

Since this part of the system is not clocked, there is no speed advantage for a serial adder. A parallel adder will use fewer gates, since no intermediate registers are needed for pipe-delays. A fast-carry look-ahead adder can be used to provide a sufficient time delay for the output to settle. The block adder/comparators 1100 and 1102 can be more efficient by comparing just the high bits, since precision is not critical. Pipe delays in the block adder/comparators 1100 and 1102 can reduce power consumption by lowering the number of bits that change state as the output settles.

Figure 12:
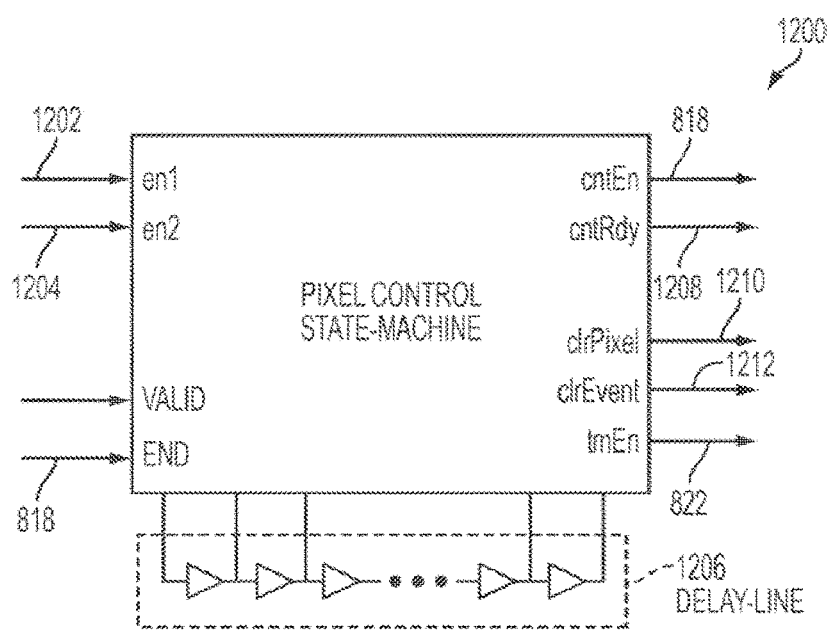
FIG. 12 depicts an exemplary pixel control state machine in accordance with embodiments of the invention.

FIG. 12 depicts an exemplary Pixel Control State Machine 1200 in accordance with the digital embodiments of the invention. Each Pixel Module 800 has an independent Pixel Control Module state-machine 1200. When a Pixel Module 800 detects an event, it generates a start signal. Based on the status of other pixels, the Event Control Module 1000 asserts one or both enable signals en1 1202 and en2 1204 to the state-machine 1200. The state-machine 1200 will then send control signals to resources in the cell modules 704 and pixel modules 800 to determine if the triggering event was a dark-current pulse or a gamma-event. If the triggering event is a dark-current pulse, the pixel is made ready to detect the next event as quickly as possible. If the trigger was due to a gamma-event, the controller 1200 may optionally continue to process the block to obtain a count of all microcells set in the block at the end of the event for the energy qualification.

The discriminator 402 responds to asynchronous events, and recovers from dark-current pulses as quickly as possible to maximize throughput. This is one reason that the discriminator is not clocked. This eliminates the need to synchronize signals to or from a clock. Level-mode digital systems rely on gate and routing delays to ensure predictable transitions between machine states. In FIG. 12, one or more delay-lines can be sufficient to synchronize transitions between states. If a gamma-event is detected, a pulse through a longer delay-line can be used to determine the integration time in which the total photon count is collected for the optionally energy qualification. Since various taps on these delay lines drive various gate loads, timing cannot be maintained as precisely as in the case of an unloaded delay-line 808. This is why a separate delay line 808 is used to generate the time-mark in the pixel module 800.

Although the exemplary state-machine 1200 is described herein, that description is for illustrative purposes only. It is appreciated that other state-machines can be used in accordance with the invention.

The illustrative state-machine 1200 works as follows:

Enable signals en1 1202 and en2 1204 are inputs from the Event Control Module 1000 and indicate that a pixel has detected an event. If both enable signals 1202 and 1204 are set, the secondary pixels in the block are available so the event can be processed. If only one enable signal is set, the secondary pixels are busy, and the event should be ignored. The pixel can be cleared after the time-mark has been flushed from the delay line 808 in the Pixel Module 800. If both enables 1202 and 1204 are set, other primary pixels will be prevented from processing events by the Event Control Module 1000, that need to share secondary pixels.

When the pixel is enabled to process an event, the controller will wait for a delay corresponding to $T_{del}$ 520 before raising the cntEn signal 818. In this digital embodiment, this delay is implemented by the delay-line 808 in each pixel control module 800. The rising edge of cntEn 818 will cause the register in the pixel module 800 to capture the state of all microcells. The counter in each pixel module 800 will update, after which the block sum will update. The valid output of the comparator will settle to its correct value. The controller will then make a decision to continue processing the pixel, or ignore it.

If the valid signal from the comparator 1100 indicates the event was a dark-current pulse, it disables tmEn 822, preventing the time-mark tm 526 from leaving the pixel module 800. The controller then waits for an end pulse to indicate that the time-mark has been flushed from the high-precision delay line in the pixel module 800. If a gamma-event was detected, the controller 1200 asserts tmEn 822 allowing the flip-flop 810 to be set, creating the time mark 526. Optionally, the controller waits for a longer delay to allow the block sum to update after all (or most) of the photons from the detector have been collected. The controller 1200 will raise cntEn 818 again to count the total number of cells set due to the current gamma event. After another delay to allow the block count to settle, the controller 1200 strobes cntRdy 1208 to signal down-stream hardware that the final energy count is valid. The block count can be captured by a register on the rising edge of cntRdy 1208. This process to estimate the total gamma in the energy is optional.

After the event has been processed, clrPixel 12010 and clrEvent 1212 pulses to clear registers in the Event Control Module 1000 and Cell Modules 704, making the pixel ready to capture the next event. If the event was a dark-current pulse, the pixel will become active after the minimum time needed to determine the type of event. The Control State-Machine 1200 controls the primary and secondary Cell Modules 704 and Pixel Modules 800 in the block. Since every pixel can function as a primary or secondary pixel, control signals will be OR functions from several pixel control module state-machines 1200. Errors in which multiple state-machines attempt to control the same pixel can occur, but will be rare. These events will likely fail the energy qualification test, and be ignored.

Figure 13:
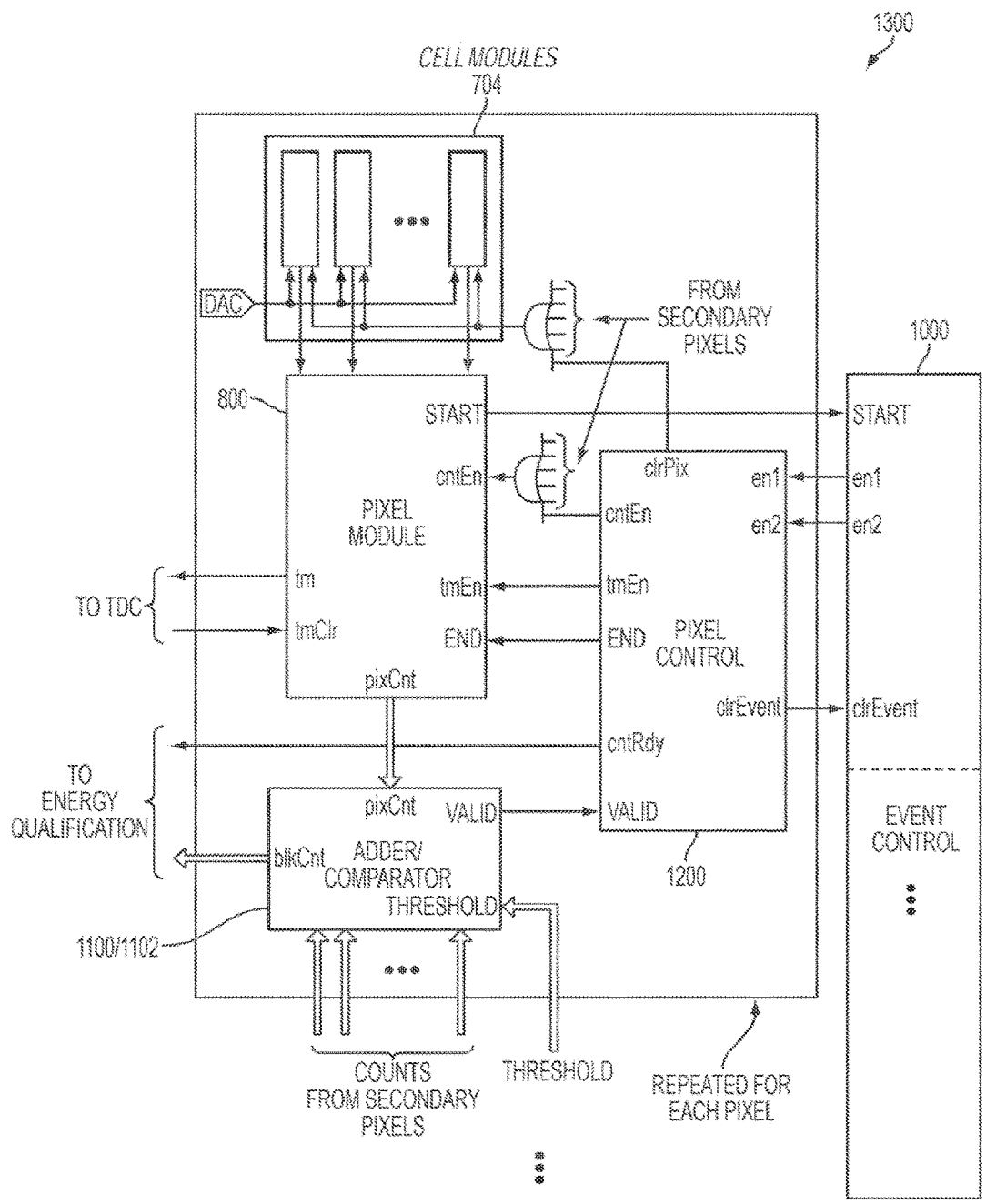
FIG. 13 depicts an exemplary top-level architecture for a digital discriminator in accordance with embodiments of the invention.

FIG. 13 depicts an exemplary top-level architecture 1300 for a fully digital discriminator in accordance with embodiments of the invention. The top-level architecture 1300 includes the Cell Modules 704, Pixel Module 800, Pixel Control State-Machine 1200, Event Control Module 1000, and adder/comparator(s) 1100 and 1102. The outputs are: A time-mark tm 526 to the TDC; and a count of the number of microcells (blkCnt) 1302 set in the block during an integration interval in which all (or most) of the photons from the detector should have been collected. The data is valid when the cntRdy 1208 output is asserted.

Figure 14:
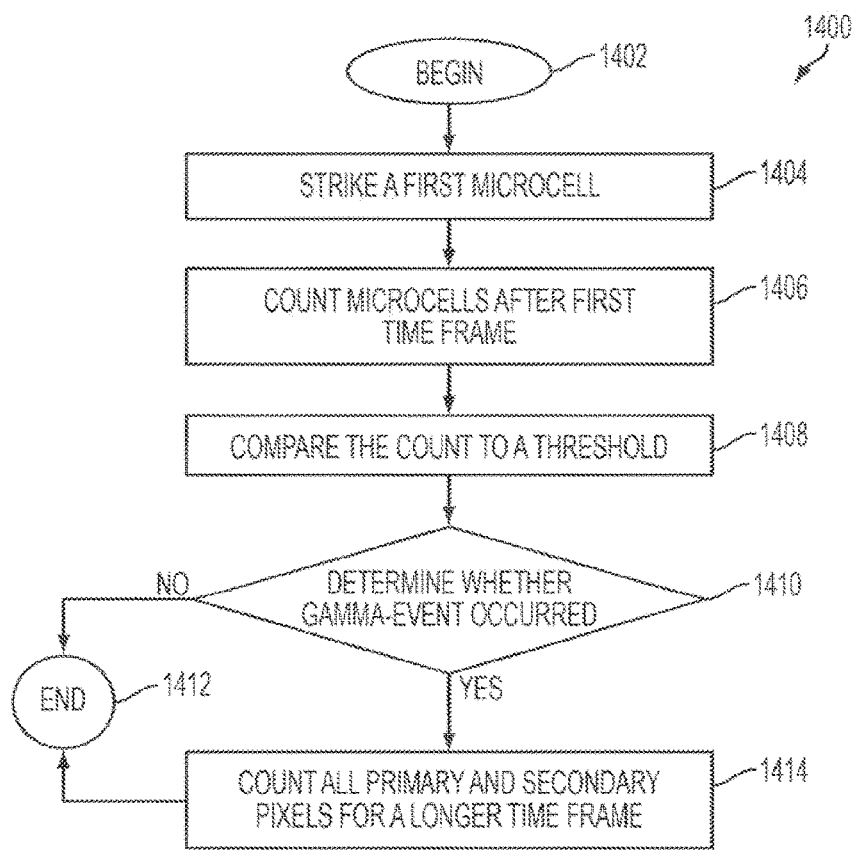
FIG. 14 depicts an exemplary method in accordance with embodiments of the invention.

FIG. 14 depicts an exemplary method 1400 in accordance with embodiments of the invention. The method 1400 begins at step 1402 and proceeds to step 1404.

At step 1404, a first microcell is struck by a photon. This first microcell is one microcell in a microcell array of a pixel (typically the pixel includes about 3600 microcells). The number of pixels in a block can vary (e.g., a 5×5 pixel array or an 8×8 pixel array). The pixel containing the first microcell is referred to as the "primary pixel." After the first microcell is struck, the method 1400 proceeds to step 1406.

At step 1406, after a first time frame (e.g., about ins to about 5 ns) all of the microcells that were struck in the primary pixel and all of the microcells that were struck in the secondary pixels (associated with the primary pixel) in the block are counted. As explained above, each primary pixel has multiple secondary pixels associated therewith. After counting, the method 1400 proceeds to step 1408.

At step 1408, the count (i.e., number) of the struck microcells is compared to a threshold number.

At step 1410, a determination is made whether the count exceeds the threshold. If the count exceeds the threshold then it is determined that the first microcell was struck by a photon due to a gamma-event. However, if the count does not exceed the threshold then it is determined that the first microcell generated a dark pulse and is ignored. Note that ignoring the striking of the first microcell can be done without deactivating microcells. If a negative determination is made a step 1410, the method 1400 proceeds to and ends at step 1412.

If however it is determined at step 1410 that a gamma event has occurred, the method 1400 proceeds to step 1414. At step 1414 a long-term (e.g., about 50 ns to about 100 ns) count of all primary and secondary pixels is collected to estimate the energy content of the gamma. This additional information is provided to down-stream processes.

While the foregoing is directed to a fully digital embodiment of the present invention, other and further embodiments of the invention may be devised without departing from the basic scope thereof, and the scope thereof is determined by the claims that follow.

We claim:
1. A method, comprising:
accumulating a charge from primary and secondary pixels;
generating a first logic pulse when said charge accumulation exceeds a timing threshold, the timing threshold setting a charge magnitude for a first detection of the charge accumulation;
delaying said first logic pulse by a first time period to form a delayed output, wherein
said first time period is greater than a formation time for said charge accumulation to exceed an arming threshold that indicates a charge magnitude above which the charge accumulation represents an event at the primary and secondary pixel;
generating a high logic pulse when said charge accumulation exceeds said arming threshold; and
applying said high logic pulse to said delayed output.
2. The method of claim 1 wherein said delayed output is a positive going edge for a flip-flop clock-input, of a flip-flop, after said arming threshold is exceeded.
3. The method of claim 2 wherein output of said flip-flop creates a time-mark, wherein said time-mark is valid after an additional fixed time delay.
4. The method of claim 3 wherein said time mark is equal to said first time period plus said additional fixed time delay.

* * * * *